US011818864B2

(12) United States Patent
Chen et al.

(10) Patent No.: US 11,818,864 B2
(45) Date of Patent: Nov. 14, 2023

(54) TIERED IMMERSION COOLING SYSTEM

(71) Applicant: Quanta Computer Inc., Taoyuan (TW)

(72) Inventors: Chao-Jung Chen, Taoyuan (TW);
Ta-Chih Chen, Taoyuan (TW);
Chih-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 201 days.

(21) Appl. No.: 17/451,692

(22) Filed: Oct. 21, 2021

(65) Prior Publication Data
US 2023/0052701 A1 Feb. 16, 2023

Related U.S. Application Data

(60) Provisional application No. 63/260,308, filed on Aug. 16, 2021.

(51) Int. Cl.
*H05K 7/20* (2006.01)
(52) U.S. Cl.
CPC ..... *H05K 7/20236* (2013.01); *H05K 7/20781* (2013.01)
(58) Field of Classification Search
CPC ........... H05K 7/20236; H05K 7/20781; H05K 7/20772; H05K 5/0217; H05K 5/0234
See application file for complete search history.

(56) References Cited

U.S. PATENT DOCUMENTS

| | | | | |
|---|---|---|---|---|
| 7,794,027 | B2 * | 9/2010 | Calabria | A47B 77/10 312/311 |
| 8,424,983 | B1 * | 4/2013 | Strauss | A47B 51/00 312/247 |
| 9,861,194 | B1 * | 1/2018 | Park | A47B 67/04 |
| 9,872,561 | B1 * | 1/2018 | Alfaro | A47B 88/457 |
| 10,939,581 | B1 * | 3/2021 | Chen | H05K 7/20781 |
| 11,317,714 | B2 * | 5/2022 | Gevrey | A47B 51/00 |
| 2011/0183051 | A1 * | 7/2011 | Skender | A23L 3/165 426/240 |

* cited by examiner

*Primary Examiner* — Abhishek M Rathod
(74) *Attorney, Agent, or Firm* — NIXON PEABODY LLP

(57) ABSTRACT

A tiered immersion cooling system includes a chassis, a cabinet frame slidably mounted to the chassis, an upper immersion tank, and a lower immersion tank. The cabinet frame is slidable between a first internal position and a first external position. Sliding motion of the cabinet frame is in a horizontal direction along a depth of the chassis. The upper immersion tank is slidably mounted to the chassis. The upper immersion tank is slidable with the cabinet frame in the horizontal direction. The upper immersion tank slides relative to the cabinet frame, in a vertical direction along a height of the chassis. The lower immersion tank is positioned below the upper immersion tank in the vertical direction. The lower immersion tank is mounted to slide independently from the cabinet frame, in the horizontal direction. The lower immersion tank slides between a second internal and a second external position.

20 Claims, 5 Drawing Sheets

TIERED IMMERSION COOLING SYSTEM

CROSS REFERENCE TO RELATED APPLICATIONS

This application claims priority to and the benefits of U.S. Provisional Patent No. 63/260,308 filed on Aug. 16, 2021, titled "Cabinet Design Of Suspended Immersion Cooling System," the contents of which are hereby incorporated by reference herein in their entirety.

FIELD OF THE INVENTION

The present invention relates generally to a cooling system for a computer system, and more specifically, to a tiered immersion cooling system.

BACKGROUND OF THE INVENTION

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In an immersion liquid cooling system, heat-generating components in a rack, such as servers, switches, and storage devices, will be immersed in a tank holding coolant. The chassis of such a system is not sealed, and the coolant liquid can circulate between and through the components to carry away generated heat. One type of immersion tank is a rectangular-shaped immersion tank. This type of tank has disadvantages when being repaired or assembled, in that the heat-generating components need to be removed directly upward from the immersion tank. This results in the repairing or assembling operation being laborious. Further, the heat-generating components are typically placed side by side in the immersion tank, and thus such a system suffers from low power density.

Thus, there is a need for an immersion cooling system that overcomes one or more of such disadvantages. The present disclosure is directed to such an immersion cooling system.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a tiered immersion cooling system includes a chassis, a cabinet frame slidably mounted to the chassis, an upper immersion tank for storing and cooling a first electronic device, and a lower immersion tank for storing and cooling a second electronic device. The cabinet frame is slidable between (i) a first internal position in which the cabinet frame is substantially within the chassis, and (ii) a first external position in which the cabinet frame is substantially external to the chassis. Sliding motion of the cabinet frame is in a horizontal direction along a depth of the chassis. The upper immersion tank is slidably mounted to the chassis. The upper immersion tank is slidable with the cabinet frame in the horizontal direction. The upper immersion tank slides relative to the cabinet frame, in a vertical direction along a height of the chassis. The lower immersion tank is positioned below the upper immersion tank in the vertical direction. The lower immersion tank is mounted to slide independently from the cabinet frame, in the horizontal direction. The lower immersion tank slides between (i) a second internal position in which the lower immersion tank is substantially within the chassis, and (ii) a second external position in which the lower immersion tank is substantially external to the chassis.

In some aspects, the upper immersion tank stores a plurality of servers, and the upper immersion tank includes a liquid coolant for cooling the plurality of servers. In some aspects, the tiered immersion cooling system further includes a third electronic device. The third electronic device is positioned within the chassis, and coupled to a server of the plurality of servers. In some aspects, the third electronic device is a switch system. In some aspects, the third electronic device is coupled to the server via a cable, and remains coupled to the server regardless of a position of the upper immersion tank. In some aspects, the plurality of servers stored in the upper immersion tank is arranged vertically.

In some aspects, the lower immersion tank stores a plurality of servers, and the lower immersion tank includes a liquid coolant for cooling the plurality of servers. In some aspects, the tiered immersion cooling system further includes a third electronic device, which is positioned within the chassis. The third electronic device is coupled to a server of the plurality of servers via a cable, and remains coupled to the server regardless of a position of the lower immersion tank. In some aspects, the plurality of servers stored in the lower immersion tank is arranged vertically.

In some aspects, the chassis further includes a pulley system coupled to the upper immersion tank. The pulley system is configured to lower and raise the upper immersion tank in the vertical direction. In some aspects, the pulley system includes a wheel that (i) lowers the upper immersion tank when the wheel is rotated clockwise, and (ii) raises the upper immersion tank when the wheel is rotated counterclockwise.

In some aspects, the lower immersion tank slides in the horizontal direction regardless of a position of the cabinet frame.

According to certain aspects of the present disclosure, a method for removing an electronic device from a tiered immersion cooling system is disclosed as follows. A cabinet frame, an upper immersion tank, and a lower immersion tank are slidably mounted in a chassis of an immersion cooling system. The upper immersion tank stores and cools an electronic device. The cabinet frame is pulled in a horizontal direction that is along a depth of the chassis. As such, the cabinet frame and the upper immersion tank are slid between (i) a first position substantially within the chassis and (ii) a second position substantially external to the chassis. The upper immersion tank is lowered relative to the cabinet frame, in a vertical direction along a height of the chassis. The electronic device is removed from the upper immersion tank.

In some aspects, a plurality of servers is stored in the upper immersion tank. The plurality of servers is cooled with a liquid coolant within the upper immersion tank. In some aspects, at least one server of the plurality of servers is coupled to another electronic device of the chassis, via a cable. The at least one server remains coupled to the another electronic device regardless of a position of the upper immersion tank. In some aspects, the cabinet frame is caused to slide via a pulley system that is coupled to the upper immersion tank. A wheel of the pulley system is rotated in a clockwise direction to lower the upper immersion tank. In some aspects, the upper immersion tank is returned to the first position.

In some aspects, a lower immersion is mounted below the upper immersion tank. The lower immersion tank is slide between (i) a third position substantially within the chassis and (ii) a fourth position substantially external to the chassis. Another electronic device is removed from the lower immersion tank. In some aspects, the another electronic device is removed from the lower immersion tank after the upper immersion tank is returned to the first position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1:
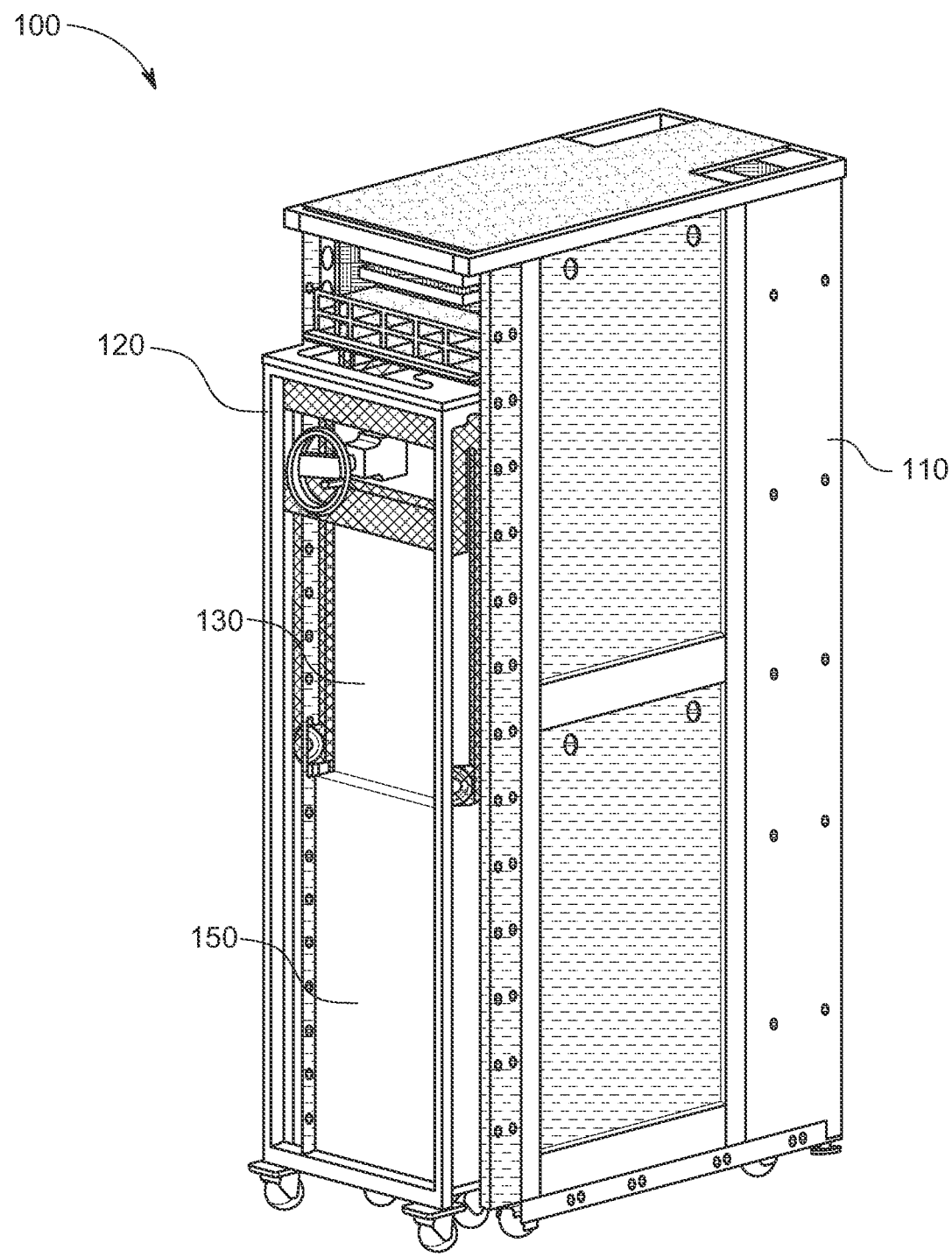
FIG. 1 is a perspective view of a tiered immersion cooling system, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal configuration, respectively. Additionally, words of direction, such as "top," "bottom," "left," "right,"

"above," and "below" are intended to relate to the equivalent direction as depicted in a reference illustration; as understood contextually from the object(s) or element(s) being referenced, such as from a commonly used position for the object(s) or element(s); or as otherwise described herein.

As discussed above, due to the improvement of high-performance systems, the amount of heat that needs to be removed in a computing center (e.g., a data center) becomes higher with each new generation of electronic components (e.g., servers). With the advent of more powerful components, traditional air cooling in combination with fan systems is inadequate to sufficiently remove heat generated by newer generation components. Liquid cooling is the currently accepted solution for rapid heat removal due to the superior thermal performance from liquid cooling.

In an immersion liquid cooling system, heat-generating components in a rack, such as servers, switches, and storage devices, will be immersed in a tank holding coolant. Immersion cooling is a type of liquid cooling technology that directly immerses the heat-generating components in a non-conductive liquid. The heat (or energy) generated by the components is directly transferred to the non-conductive liquid, and no other active cooling parts are required (e.g., fans). One type of immersion tank is a rectangular-shaped immersion tank. This type of tank has disadvantages when being repaired or assembled, in that the heat-generating components need to be removed directly upward out of the immersion tank, or installed downward into the immersion tank. This results in the repairing or assembling operation being laborious. In addition, the heat-generating components are typically placed side by side in the traditional immersion tank for easy access, and thus such a system suffers from low power density.

The present disclosure is directed to a tiered immersion cooling system that allows the efficient heat dissipation from liquid cooling, while providing high power density. Specifically, the tiered immersion cooling system includes at least two immersion tanks arranged vertically relative to one another, where a plurality of electronic components (e.g., servers or other electronics) can be arranged vertically in each immersion tank.

Referring to FIG. 1, a perspective view of a tiered immersion cooling system 100 is illustrated. The tiered immersion cooling system 100 includes a chassis 110, a cabinet frame 120, an upper immersion tank 130, and a lower immersion tank 150. Each of the upper immersion tank 130 and the lower immersion tank 150 may include a liquid coolant for cooling the electronic components stored in the immersion tank. When the upper immersion tank 130 and the lower immersion tank 150 are stored within the chassis 110, the lower immersion tank 150 is positioned vertically below the upper immersion tank 130, and together take up majority of the space within the chassis 110. For example, in some implementations, the chassis 110 may be a server chassis, and each of the upper immersion tank 130 and the lower immersion tank 150 may store and cool a plurality of servers.

Figure 2:
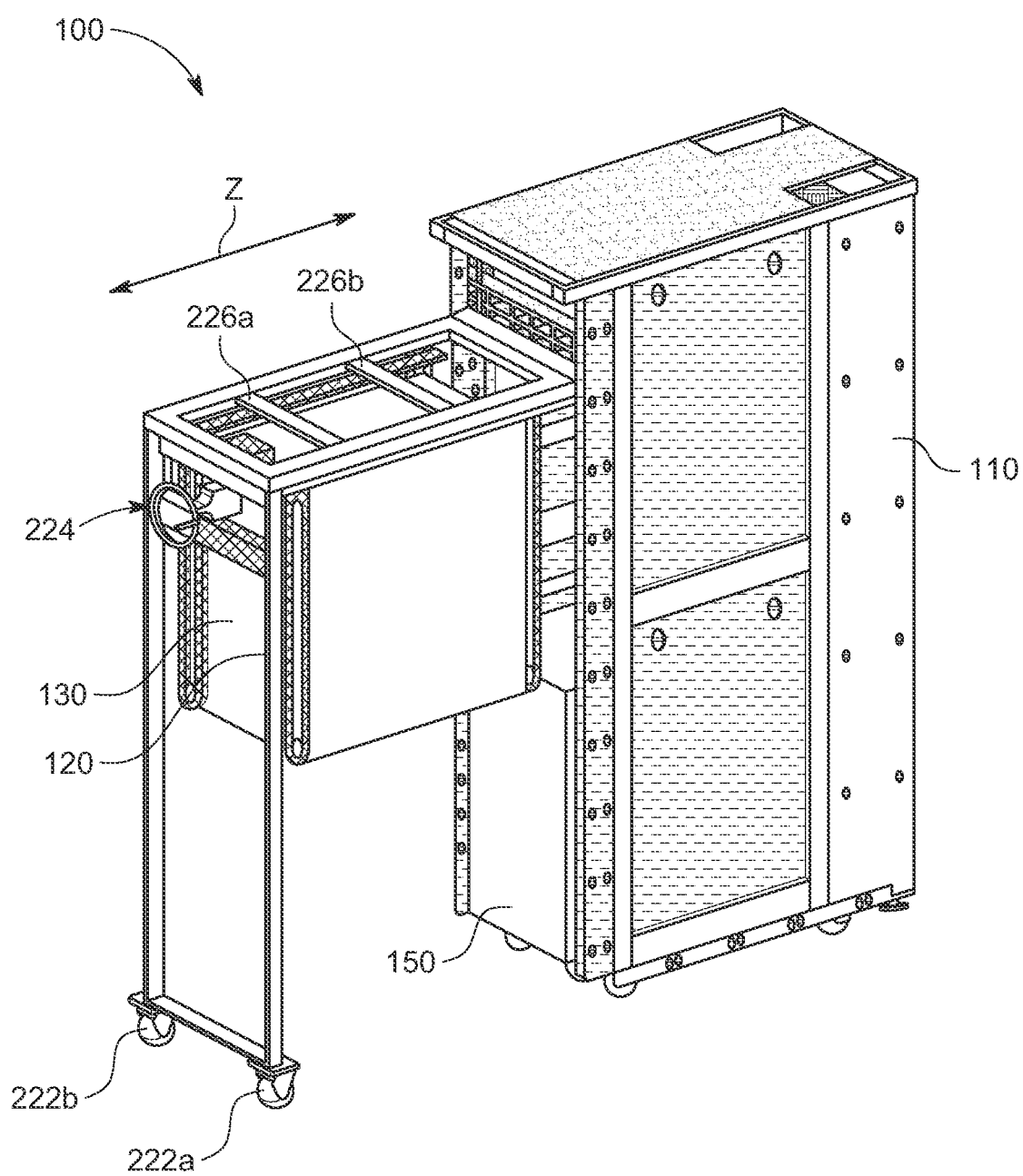
FIG. 2 is a perspective view of the tiered immersion cooling system of FIG. 1 showing a suspended upper immersion tank, according to certain aspects of the present disclosure.

Referring to FIG. 2, a perspective view of the tiered immersion cooling system 100 is illustrated, and showing the upper immersion tank 130 suspended from the ground. The tiered immersion cooling system 100 in FIG. 2 is the same as, or similar to, the tiered immersion cooling system 100 in FIG. 1, where identical reference numerals designate equivalent elements. In some implementations, the cabinet frame 120 includes a plurality of frame rollers that aids in sliding the cabinet frame 120 in a horizontal direction Z that is along a depth of the chassis 110. In this example, the cabinet frame 120 includes a first frame roller 222a and a second frame roller 222b. As such, the cabinet frame 120 is slidably mounted to the chassis 110, and is slidable between (i) a first internal position (FIG. 1) in which the cabinet frame 120 is substantially within the chassis 110, and (ii) a first external position (FIG. 2) in which the cabinet frame 120 is substantially external to the chassis 110.

Still referring to FIG. 2, the upper immersion tank 130 is coupled to the cabinet frame 120 via a sliding support system 224, such that the upper immersion tank 130 does not shift in the horizontal direction Z relative to the cabinet frame 120. As such, the upper immersion tank 130 can slide with the cabinet frame 120 in the horizontal direction Z when the cabinet frame 120 is pulled out of the chassis 110, where the upper immersion tank 130 remains suspended at this stage.

In some implementations, the cabinet frame 120 further includes a plurality of slats (such as the first slat 226a and the second slat 226b) that provides structural support to the cabinet frame 120 itself, and/or to the sliding support system 224. Additionally, or alternatively, in some implementations, the slats 226a and 226b provides additional separation to keep any electronic devices positioned above the cabinet frame 120 from falling into the upper immersion tank 130. However, due to the slats 226a and 226b at the top of the cabinet frame 120, it is difficult to remove any electronic device stored within the upper immersion tank 130, while the upper immersion tank 130 is suspended at this position (e.g., little space between the upper immersion tank 130 and the slats 226a and 226b). Thus, to allow easy access of the electronic devices stored within the upper immersion tank 130, the upper immersion tank 130 can further be lowered.

Figure 3:
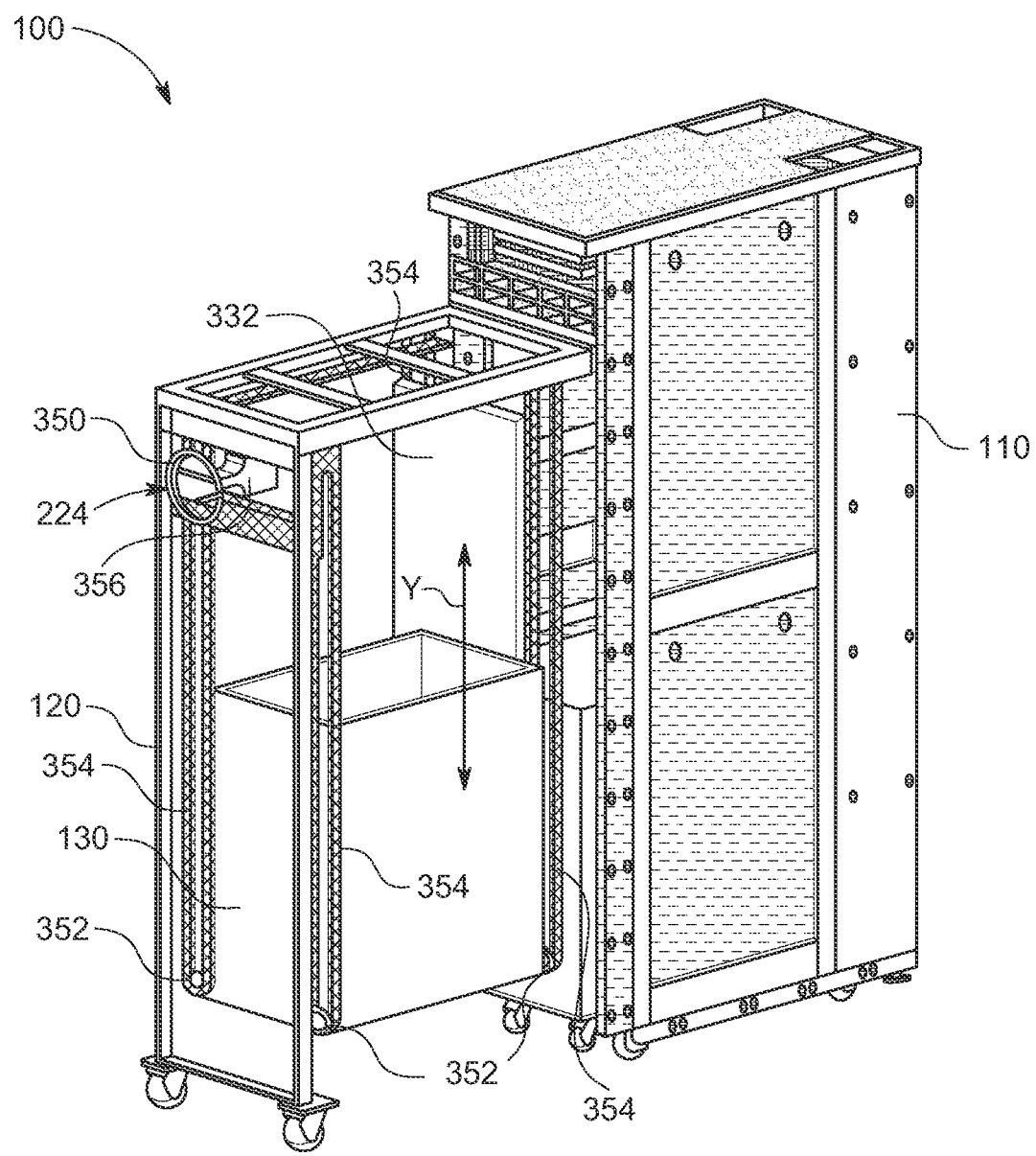
FIG. 3 is a perspective view of the tiered immersion cooling system of FIG. 1 showing a lowered upper immersion tank, according to certain aspects of the present disclosure.

Referring to FIG. 3, a perspective view of the tiered immersion cooling system 100 is illustrated, and showing the upper immersion tank 130 lowered from its suspended position in FIG. 2. The tiered immersion cooling system 100 in FIG. 3 is the same as, or similar to, the tiered immersion cooling system 100 in FIGS. 1-2, where identical reference numerals designate equivalent elements. In some implementations, the sliding support system 224 includes a pulley system, which includes a control wheel 350, a plurality of pulleys 352, and a corresponding plurality of ropes 354. In this example, the sliding support system 224 includes four pulleys 352 (the fourth of which not shown) and four corresponding ropes 354.

The sliding support system 224 (e.g., the pulley system) causes the upper immersion tank 130 to lower and/or raise in the vertical direction Y relative to the cabinet frame 120. The control wheel 350 activates and/or controls the plurality of pulleys 352 and its corresponding plurality of ropes 354, such that (i) the upper immersion tank 130 is lowered when the control wheel 350 is rotated clockwise, and (ii) the upper immersion tank 130 is raised when the control wheel 350 is rotated counterclockwise. In other implementations, the control wheel 350 activates and/or controls the plurality of pulleys 352 and its corresponding plurality of ropes 354, such that (i) the upper immersion tank 130 is raised when the control wheel 350 is rotated clockwise, and (ii) the upper immersion tank 130 is lowered when the control wheel 350 is rotated counterclockwise. In some implementations, a lock system 356 is coupled to the control wheel 350 to lock the control wheel 350 from rotating, thereby securing the upper immersion tank 130 in place at any given position along the vertical direction Y.

While the upper immersion tank 130 is affixed to the cabinet frame 120 in the horizontal direction Z (FIG. 2), the upper immersion tank 130 can slide relative to the cabinet frame 120 in a vertical direction Y (FIG. 3) along a height of the chassis 110. As shown in FIG. 3, when the upper immersion tank 130 is lowered, the relative displacement of the upper immersion tank 130 (comparing FIG. 2 and FIG. 3) provides additional operating space for a user to access the electronic components being stored and cooled in the upper immersion tank 130, such as the electronic component 332 (e.g., a server). In addition, because of this additional operating space, the electronic components can be stored vertically adjacent to one another within the upper immersion tank 130, thereby increasing the power density of the entire computing system, as more electronic components can be stored in the upper immersion tank 130 when stored vertically.

Figure 4:
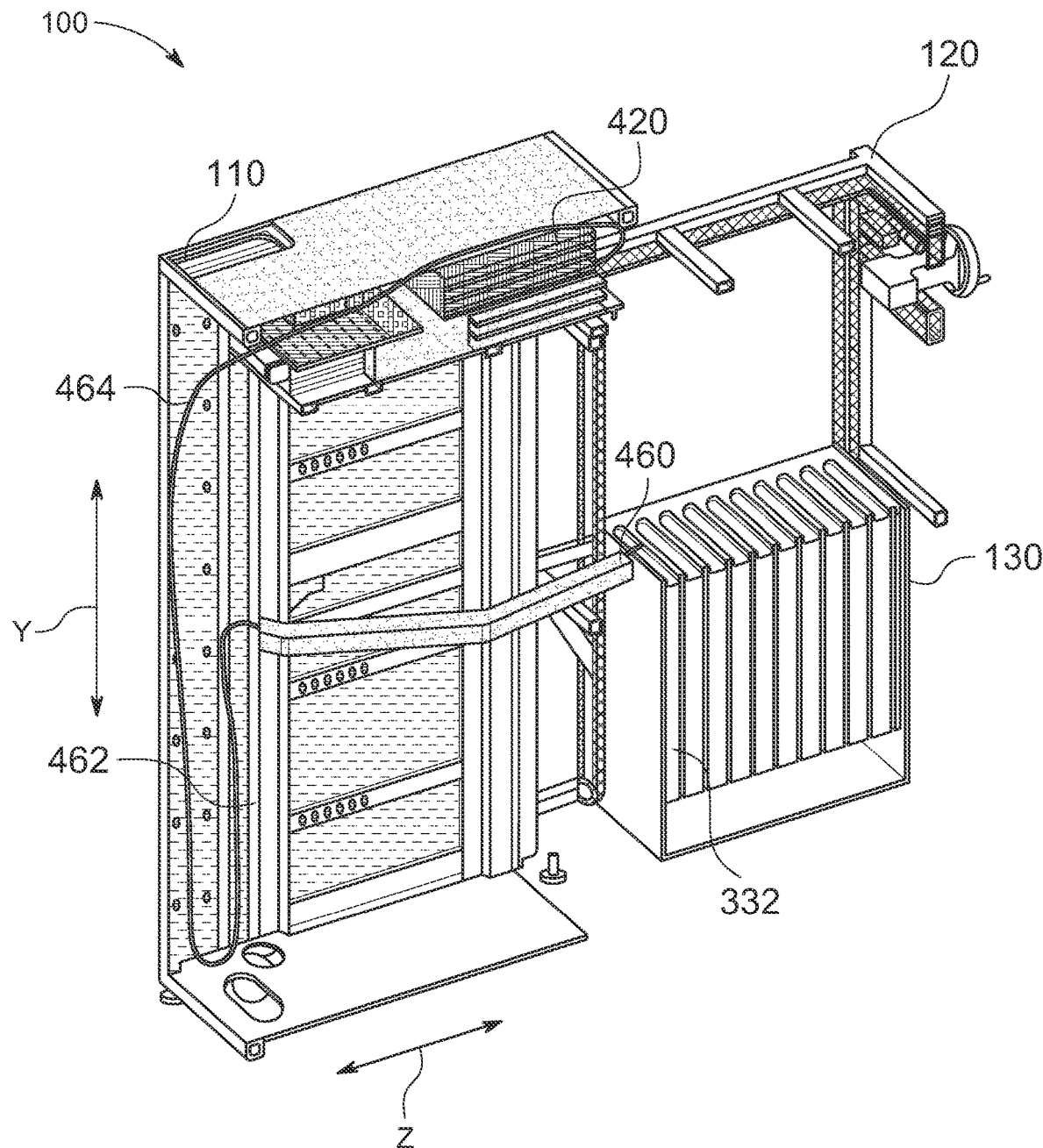
FIG. 4 is a partial perspective view of the tiered immersion cooling system of FIG. 1 showing the lowered upper immersion tank, according to certain aspects of the present disclosure.

Referring to FIG. 4, a partial perspective view of the tiered immersion cooling system 100 is illustrated, and showing the upper immersion tank 130 lowered as in FIG. 3. The tiered immersion cooling system 100 in FIG. 4 is the same as, or similar to, the tiered immersion cooling system 100 in FIGS. 1-3, where identical reference numerals designate equivalent elements. In some implementations, the electronic devices stored in the upper immersion tank 130 is connected to the tiered immersion cooling system via a cable 464 and an electronic device 420. For example, the electronic device 420 may be a switch system. The electronic device 420 provides communication between the electronic component 332 (e.g., a server) and the chassis 110 (e.g., a server chassis).

In some implementations, the chassis 110 further includes a cable management arm 460 and a cable management arm rail 462. The cable management arm 460 is hollow inside, and holds a portion of the cable 464. The cable management arm 460 allows the upper immersion tank 130 (thus the server 332) to be fully extended from the chassis 110 without the need to power off the system or disconnect any rear panel cables. The cable management arm 460 extends when the cabinet frame 120 is pulled out from the chassis 110, and retracts when the cabinet frame 120 is restored in the chassis 110. The cable management arm rail 462 causes the cable management arm 460 to slide up or down along the vertical direction Y, thereby accommodating the upper immersion tank 130 when it is being raised or lowered, respectively. As such, the electronic device 420 remains connected to the electronic component 332 regardless of the position of the upper immersion tank 130.

Figure 5:
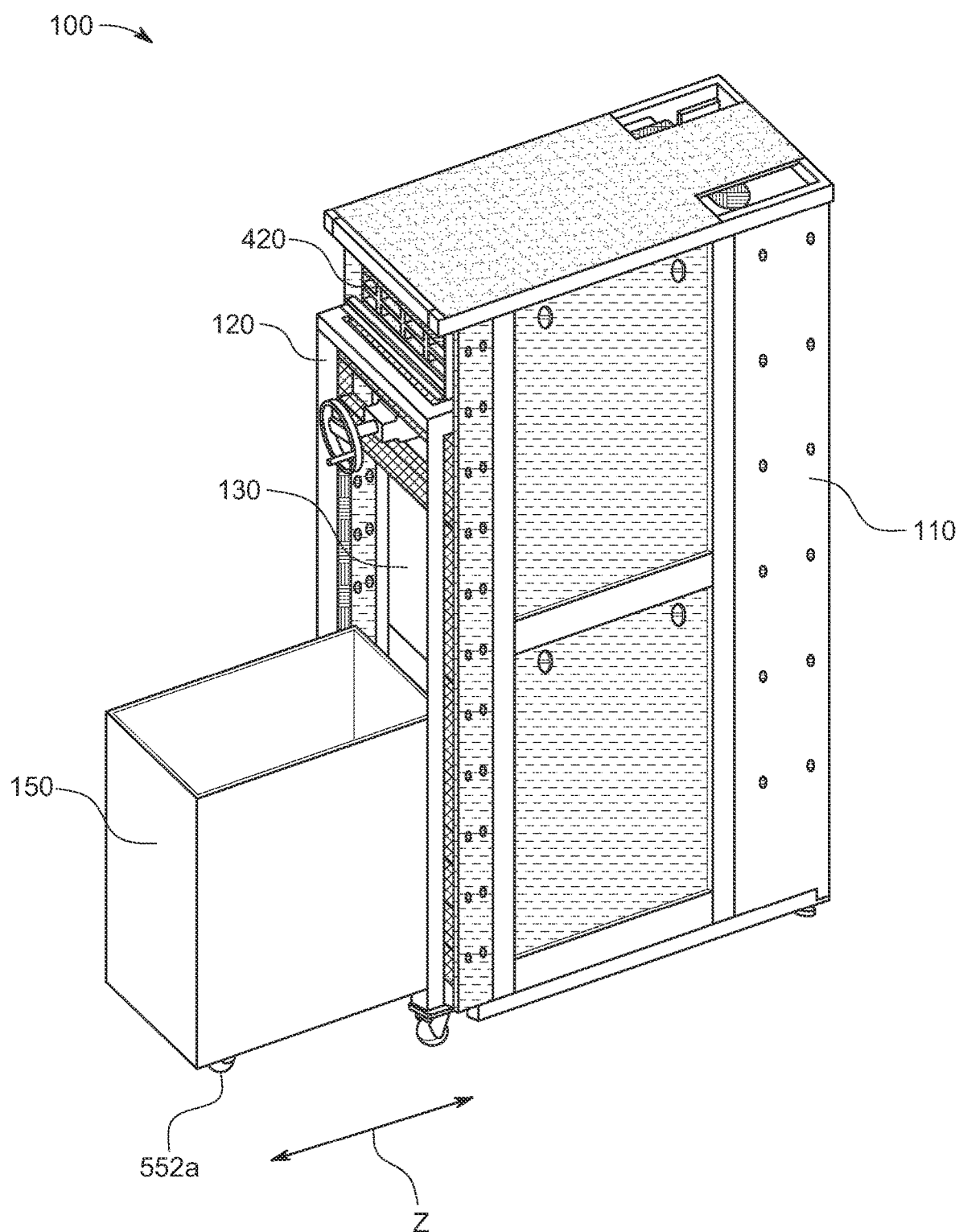
FIG. 5 is a perspective view of the tiered immersion cooling system of FIG. 1 showing the lower immersion tank, according to certain aspects of the present disclosure.

Referring to FIG. 5, a perspective view of the tiered immersion cooling system 100 is illustrated, showing the lower immersion tank 150 pulled out from the chassis 110. The tiered immersion cooling system 100 in FIG. 5 is the same as, or similar to, the tiered immersion cooling system 100 in FIGS. 1-4, where identical reference numerals designate equivalent elements. The lower immersion tank 150 may include a plurality of rollers, such as the roller 552a, to aid the lower immersion tank 150 in sliding in the horizontal direction Z. The lower immersion tank 150 slides between (i) a second internal position (FIG. 1) in which the lower immersion tank 150 is substantially within the chassis 110, and (ii) a second external position (FIG. 5) in which the lower immersion tank 150 is substantially external to the chassis 110. In this example, the lower immersion tank 150 can slide independently from the cabinet frame 120. In other words, the cabinet frame 120 (along with the upper immersion tank 130) can remain within the chassis 110, while the lower immersion tank 150 is being pulled out of the chassis 110.

Similar to the upper immersion tank 130, the lower immersion tank 150 may also include a plurality of electronic components (not shown, e.g., servers) arranged vertically. An electronic component (e.g., server) in the lower immersion tank 150 may also be connected to the electronic device 420 (e.g., a switch system) via a cable (not shown, similar to the cable 464 in FIG. 4). A cable management arm (not shown, similar to the cable management arm 460 in FIG. 4) may also expand or retract the cable for the electronic component in the lower immersion tank 150, depending on whether the lower immersion tank 150 is pulled out of or restored in the chassis 110, respectively. However, a cable management arm rail is not necessary for the lower immersion tank 150, as the lower immersion tank 150 does not move in the vertical direction. A user can access the electronic component in the lower immersion tank 150 directly from above, after the lower immersion tank 150 is pulled out from the chassis 110.

While it is shown that the tiered immersion cooling system 100 includes two immersion tanks (e.g., the upper immersion tank 130 and the lower immersion tank 150), a tiered immersion cooling system of the present disclosure can include any suitable number of immersion tanks arranged vertically relative to one another, such as three immersion tanks, four immersion tanks, five immersion tanks, etc. A separate sliding support system (e.g., the sliding support system 224 in FIG. 2 including a pulley system) may be used for any immersion tank that is not the lowermost in the vertical direction. In other words, in a tiered immersion cooling system having N immersion tanks stacked in the vertical direction, there may be N−1 pulley systems.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:
1. A tiered immersion cooling system, comprising:
 a chassis;
 a cabinet frame slidably mounted to the chassis, the cabinet frame being slidable between (i) a first internal position in which the cabinet frame is substantially within the chassis and (ii) a first external position in which the cabinet frame is substantially external to the chassis, sliding motion of the cabinet frame being in a horizontal direction along a depth of the chassis;

an upper immersion tank configured to store and cool a first electronic device, the upper immersion tank being slidably mounted to the chassis, the upper immersion tank being slidable with the cabinet frame in the horizontal direction, the upper immersion tank sliding relative to the cabinet frame in a vertical direction along a height of the chassis; and a lower immersion tank configured to store and cool a second electronic device, the lower immersion tank being positioned below the upper immersion tank in the vertical direction, the lower immersion tank being mounted to slide independently from the cabinet frame in the horizontal direction, the lower immersion tank sliding between (i) a second internal position in which the lower immersion tank is substantially within the chassis and (ii) a second external position in which the lower immersion tank is substantially external to the chassis.

2. The tiered immersion cooling system of claim 1, wherein the upper immersion tank stores a plurality of servers, the upper immersion tank including a liquid coolant for cooling the plurality of servers.

3. The tiered immersion cooling system of claim 2, further comprising a third electronic device positioned within the chassis and coupled to a server of the plurality of servers.

4. The tiered immersion cooling system of claim 3, wherein the third electronic device is a switch system.

5. The tiered immersion cooling system of claim 3, wherein the third electronic device is coupled to the server via a cable and remains coupled to the server regardless of a position of the upper immersion tank.

6. The tiered immersion cooling system of claim 2, wherein the plurality of servers is arranged vertically.

7. The tiered immersion cooling system of claim 1, wherein the lower immersion tank stores a plurality of servers, the lower immersion tank including a liquid coolant for cooling the plurality of servers.

8. The tiered immersion cooling system of claim 7, further comprising a third electronic device positioned within the chassis and coupled to a server of the plurality of servers via a cable, the third electronic device remaining coupled to the server regardless of a position of the lower immersion tank.

9. The tiered immersion cooling system of claim 7, wherein the plurality of servers is arranged vertically.

10. The tiered immersion cooling system of claim 1, wherein the chassis further includes a pulley system coupled to the upper immersion tank, the pulley system being configured to lower and raise the upper immersion tank in the vertical direction.

11. The tiered immersion cooling system of claim 10, wherein the pulley system includes a wheel that (i) lowers the upper immersion tank when the wheel is rotated clockwise and (ii) raises the upper immersion tank when the wheel is rotated counterclockwise.

12. The tiered immersion cooling system of claim 1, wherein the lower immersion tank slides in the horizontal direction regardless of a position of the cabinet frame.

13. A method for removing an electronic device from a tiered immersion cooling system, the method comprising:

slidably mounting a cabinet frame, an upper immersion tank, and a lower immersion tank in a chassis of an immersion cooling system, the upper immersion tank storing and cooling an electronic device;

pulling the cabinet frame in a horizontal direction that is along a depth of the chassis, thereby sliding the cabinet frame and the upper immersion tank between a first position substantially within the chassis and a second position substantially external to the chassis;

lowering the upper immersion tank relative to the cabinet frame in a vertical direction along a height of the chassis; and removing the electronic device from the upper immersion tank.

14. The method of claim 13, further comprising:

storing a plurality of servers in the upper immersion tank; and cooling the plurality of servers with a liquid coolant within the upper immersion tank.

15. The method of claim 14, wherein at least one server of the plurality of servers is coupled to another electronic device of the chassis via a cable, the at least one server remaining coupled to the another electronic device regardless of a position of the upper immersion tank.

16. The method of claim 14, wherein the plurality of servers is arranged vertically.

17. The method of claim 13, further comprising:

sliding the cabinet frame via a pulley system that is coupled to the upper immersion tank; and rotating in a clockwise direction a wheel of the pulley system to lower the upper immersion tank.

18. The method of claim 13, further comprising returning the upper immersion tank to the first position.

19. The method of claim 13, further comprising:

mounting a lower immersion below the upper immersion tank;

sliding the lower immersion tank between a third position substantially within the chassis and a fourth position substantially external to the chassis; and removing another electronic device from the lower immersion tank.

20. The method of claim 19, wherein the another electronic device is from the lower immersion tank after the upper immersion tank is returned to the first position.

* * * * *